(12) United States Patent
Rieke

(10) Patent No.: US 7,442,759 B2
(45) Date of Patent: Oct. 28, 2008

(54) WATER-SOLUBLE POLYTHIOPHENE POLYMERS

(75) Inventor: Reuben Rieke, Lincoln, NE (US)

(73) Assignee: Rieke Metals, Inc., Lincoln, NE (US)

( * ) Notice: Subject to any disclaimer, the term of this patent is extended or adjusted under 35 U.S.C. 154(b) by 154 days.

(21) Appl. No.: 11/425,934

(22) Filed: Jun. 22, 2006

(65) Prior Publication Data

US 2006/0264600 A1 Nov. 23, 2006

Related U.S. Application Data

(63) Continuation of application No. PCT/US2004/041914, filed on Dec. 10, 2004.

(60) Provisional application No. 60/532,545, filed on Dec. 22, 2003.

(51) Int. Cl.
*C08F 6/06* (2006.01)
*C08G 75/00* (2006.01)
*C08G 61/00* (2006.01)
*C08G 61/12* (2006.01)

(52) U.S. Cl. .................. 528/373; 528/377; 528/378; 528/379; 528/380; 528/488; 528/489; 528/495

(58) Field of Classification Search .................. 528/373, 528/377, 378, 379, 380, 488, 489, 495
See application file for complete search history.

(56) References Cited

U.S. PATENT DOCUMENTS 5,358,546 A  10/1994  Rieke
5,507,973 A  4/1996  Rieke
5,756,653 A * 5/1998  Rieke .................. 528/378
5,852,200 A  12/1998  Rieke
5,964,919 A  10/1999  Rieke
2004/0030091 A1  2/2004  McCullough et al.

FOREIGN PATENT DOCUMENTS

EP  0402269 A1  12/1990
WO  WO-2007146074 A1  12/2007

OTHER PUBLICATIONS

McCullough, The Chemistry of conducting polythiophenes; Advance Materials, vol. 10, No. 2, 1998, pp. 93-114.*

* cited by examiner

*Primary Examiner*—Duc Truong
(74) *Attorney, Agent, or Firm*—Schwegman, Lundberg & Woessner, P.A.

(57) ABSTRACT

The invention provides a water-soluble polymer having formula I:

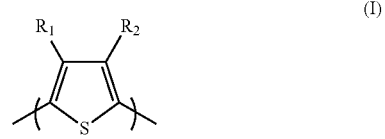

where $R_1$ and $R_2$ are independently —H, -alkyl$CO_2$A, —$(CH_2)_n$-aryl-$(CH_2)_n CO_2$A, —$(CH_2)_n$-heterocycle-$(CH_2)_n CO_2$A, or —$(CH_2)_n$-cycloalkyl-$(CH_2)_n CO_2$A, where n is an integer from 0 to 200, and A is an alkali metal cation, with the proviso that only one of $R_1$ and $R_2$ is —H. Methods of preparing the water-soluble polymers and thin films prepared therefrom are also described.

20 Claims, No Drawings

WATER-SOLUBLE POLYTHIOPHENE POLYMERS

RELATED APPLICATIONS

This application claims priority under 35 U.S.C. § 111(a) to International Application Serial No. PCT/US2004/041914, filed Dec. 10, 2004, and claims the benefit under 35 U.S.C. § 19(e) of U.S. Application Ser. No. 60/532,545, filed Dec. 22, 2003, which applications are incorporated herein by reference.

FIELD OF THE INVENTION

The invention relates to water-soluble polymers, and methods of making and using the same. More specifically, the invention relates to water-soluble polythiophene polymers, methods of making the polymers and thin films prepared therefrom.

BACKGROUND OF THE INVENTION

Polythiophene polymers have received extensive attention in recent years due to their nonlinear optical properties, electro-conductivity and many other valuable properties. They can be used in a number of applications including electrical components such as transistors, diodes, and triodes. The use of these polymers for such applications has been hampered by some of the properties of these polymers, most importantly their lack of water solubility. Conventional methods of synthesis do not create pure polymers with respect to regiospecificity. Furthermore, they are generally insoluble in aqueous systems and can be difficult to characterize. Because the polymers and/or monomers thereof are generally not soluble in water, the polymers must generally be formed in an organic solvent. It is generally desired to avoid the use of organic solvents because of issues, both economic and environmental, involved with disposing of them properly.

Therefore, there remains a need for better synthesis methods for water-soluble polythiophene polymers.

SUMMARY OF THE INVENTION

One embodiment of the invention relates to a water-soluble polymer having formula I:

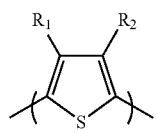

where $R_1$ and $R_2$ are independently —H, -alkyl$CO_2$A, —$(CH_2)_n$-aryl-$(CH_2)_n CO_2$A, —$(CH_2)_n$-heterocycle-$(CH_2)_n CO_2$A-, or —$(CH_2)_n$-cycloalkyl-$(CH_2)_n CO_2$A, where n is an integer from 0 to about 200, and A is an alkali metal cation, with the proviso that only one of $R_1$ and $R_2$ can be —H.

One embodiment of the invention relates to a thin film formed from a water-soluble polymer having formula I above. The thin film can be an electroconductive thin film. Another embodiment relates to an electronic component that includes the thin film. The electronic component that includes the polymer of formula I can be a diode, an organic thin film transistor, an organic light emitting diode, or the like.

One embodiment of the invention relates to a method of forming a water-soluble polymer that includes the steps of: (a) combining a zerovalent highly reactive zinc species with an organic compound having at least two stable leaving groups to form a zinc derivative reagent, wherein the organic radical of the zinc derivative reagent includes a substituted thiophene group; (b) adding a catalyst to polymerize the zinc derivative reagent; and (c) adding an alkali metal base to form an alkali metal salt of the polymer.

DETAILED DESCRIPTION OF THE INVENTION

Water-Soluble Polymers

The invention includes water-soluble polythiophene polymers. The term "polymeric" or "polymer" is used herein in its most general sense to mean a compound of repeating structural units.

The term "water-soluble" is used herein as one of skill in the art would normally use this term. In one embodiment, a polymer that is "water-soluble" is soluble in an aqueous system at levels of from about $10^{-5}$ molar to about 100 molar. In another embodiment, a polymer that is "water-soluble" is soluble in an aqueous system at levels of from about $10^{-3}$ molar to about 10 molar.

As used herein, the term "about" can indicate a variation of 10 percent of the value specified; for example about 50 percent carries a variation from 45 to 55 percent. For integer ranges, the term about can include one or two integers greater than and less than a recited integer.

One embodiment of the invention can be a water-soluble polymer having formula I:

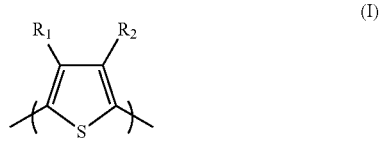

where $R_1$ and $R_2$ are independently —H, -alkyl$CO_2$A, —$(CH_2)$, -aryl-$(CH_2),CO_2$A, —$(CH_2)_n$-heterocycle-$(CH_2)_n CO_2$A-, or —$(CH_2)_n$-cycloalkyl-$(CH_2)_n CO_2$A, where n is an integer from 0 to about 200, and A is an alkali metal cation, with the proviso that only one of $R_1$ and $R_2$ can be —H.

In one embodiment, both $R_1$ and $R_2$ are -alkyl$CO_2$A, —$(CH_2)_n$-aryl-$(CH_2)_n CO_2$A, —$(CH_2)_n$-heterocycle-$(CH_2)_n CO_2$A-, or —$(CH_2)_n$-cycloalkyl-$(CH_2),CO_2$A. In another embodiment, either of $R_1$ and $R_2$ are —H and the other of $R_1$ and $R_2$ are -alkyl$CO_2$A, —$(CH_2)_n$-aryl-$(CH_2)_n CO_2$A, —$(CH_2)_n$-heterocycle-$(CH_2)_n CO_2$A-, or —$(CH_2)_n$-cycloalkyl-$(CH_2)_n CO_2$A.

As used herein "alkyl" includes a saturated linear, branched, or cyclic hydrocarbon radical. In one embodiment, alkyl has from about 1 to about 200 carbon atoms. In another embodiment, alkyl has from about 1 to about 50 carbon atoms. In another embodiment, alkyl has from about 1 to about 30 carbon atoms. In another embodiment, alkyl has 1, 2, 3, 4, 5, 6, 7, 8, 9, 10, 11, or about 12 carbon atoms. The alkyl group may optionally be substituted with one or more substituents such as fluorine, chlorine, alkyl groups having from about 1 to about 10 carbon atoms (e.g., methyl or ethyl), alkoxy groups having from about 1 to about 10 carbon atoms (e.g., methoxy or ethoxy), alkoxyalkyl groups having from about 1 to about 10 carbon atoms and one or more oxygen atoms, or amido groups having from about 1 to about 10 carbon atoms, such as acetamido. These substituents may themselves be substituted with one or more (e.g., about 1 to about 5) functional groups such as hydroxy groups, carboxy groups, acetoxy groups, or halogens.

As used herein "aryl" means a mono- or polynuclear aromatic hydrocarbon radical. Examples of "aryl" groups include, but are not limited to aromatic hydrocarbons such as a phenyl group or a naphthyl group for example. The aromatic group may optionally be substituted with one or more substituents such as fluorine, chlorine, alkyl groups having from about 1 to about 10 carbon atoms (e.g., methyl or ethyl), alkoxy groups having from about 1 to about 10 carbon atoms (e.g., methoxy or ethoxy), alkoxyalkyl groups having from about 1 to about 10 carbon atoms and one or more oxygen atoms, or amido groups having from about 1 to about 10 carbon atoms, such as acetamido. These substituents may themselves be substituted with one or more (e.g., about 1 to about 5) functional groups such as hydroxy groups, carboxy groups, acetoxy groups, or halogens.

In one embodiment, aryl is a phenyl group or a naphthyl group that is either unsubstituted or substituted.

As used herein "cycloalkyl" includes cyclopropyl, cyclobutyl, cyclopentyl, cyclohexyl, cycloheptyl, cyclooctyl, and the like. The cycloalkyl group may optionally be substituted with one or more substituents such as fluorine, chlorine, alkyl groups having from about 1 to about 10 carbon atoms (e.g., methyl or ethyl), alkoxy groups having from about 1 to about 10 carbon atoms (e.g., methoxy or ethoxy), alkoxyalkyl groups having from about 1 to about 10 carbon atoms and one or more oxygen atoms, or amido groups having from about 1 to about 10 carbon atoms, such as acetamido. These substituents may themselves be substituted with one or more (e.g., about 1 to about 5) functional groups such as hydroxy groups, carboxy groups, acetoxy groups, or halogens.

As used herein, "heterocycle" means a mono- or polynuclear saturated or unsaturated cyclic radical containing carbons and one or more (e.g., about 1 to about 5; typically about 1 to about 3) heteroatoms such as nitrogen, oxygen, phosphorus, silicon, or sulfur or a combination thereof in the ring or rings. In another embodiment, a heterocycle includes mono- or polynuclear saturated or unsaturated cyclic radicals containing carbons and one or more heteroatoms such as nitrogen, oxygen, or sulfur. This includes, but is not limited to, pyridine, pyrrol, indole, adenosine, thiazole, pyrazine, guanine, cytosine, thymine, adenine, uredine, uracil, oxazole, purine, pyrazole, hydantoin, piperazine, quinoline, xanthene, 1,10-phenanthroline, thiophene, and acridine. The heterocycle group may optionally be substituted with one or more substituents such as fluorine, chlorine, alkyl groups having from about 1 to about 10 carbon atoms (e.g., methyl or ethyl), alkoxy groups having from about 1 to about 10 carbon atoms (e.g., methoxy or ethoxy), alkoxyalkyl groups having from about 1 to about 10 carbon atoms and one or more oxygen atoms, or amido groups having from about 1 to about 10 carbon atoms, such as acetamido. These substituents may themselves be substituted with one or more (e.g., about 1 to about 5) functional groups such as hydroxy groups, carboxy groups, acetoxy groups, or halogens.

As used herein "alkali metal cation" includes lithium (Li+), sodium (Na+), potassium (K+), rubidium (Rb+), and cesium (Cs+). In one embodiment, the alkali metal cation A, is sodium (Na+), or potassium (K+). In another embodiment, the alkali metal cation A, is sodium (Na+).

In one embodiment, the variable "n" is an integer from 0 to about 50. In another embodiment, n is an integer from 0 to about 30. In a further embodiment, n is 0, 1, 2, 3, 4, 5, 6, 7, 8, 9, 10, 11, or about 12.

In one embodiment, only $R_1$ or $R_2$ is one of -alkyl$CO_2$A, —$(CH_2)_n$-aryl-$(CH_2)_n CO_2$A, —$(CH_2)_n$-heterocycle-$(CH_2)_n CO_2$A-, or —$(CH_2)_n$-cycloalkyl-$(CH_2)_n CO_2$A. In another embodiment both $R_1$ and $R_2$ are one of -alkyl$CO_2$A, —$(CH_2)_n$-aryl-$(CH_2)_n CO_2$A, —$(CH_2)_n$-heterocycle-$(CH_2)_n CO_2$A-, or $(CH_2)_n$-cycloalkyl-$(CH_2)_n CO_2$A., and are different. In one embodiment both $R_1$ and $R_2$ are one of -alkyl$CO_2$A, —$(CH_2)_n$-aryl-$(CH_2)_n CO_2$A, —$(CH_2)_n$-heterocycle-$(CH_2)_n CO_2$A-, or —$(CH_2)_n$-cycloalkyl-$(CH_2)_n CO_2$A, and are the same.

In one embodiment the water-soluble polymer is regiorandom. In another embodiment, the water-soluble polymer is regioselective. Regioselective polymers are those that have all head-head, or head-tail orientations. Regiorandom are polymers with an equal amount of each orientation (25% head-tail & head-tail, 25% head-tail & head-head, 25% tail-tail & head-tail, 25% tail-tail & head-head). For further description and discussion of regiorandom and regioselective (or regioregular) see U.S. Pat. No. 5,756,653, the disclosure of which is incorporated by reference herein. In an embodiment where neither $R_1$ or $R_2$ are —H, the polymer will be neither regiorandom nor regioregular.

The chain structure of polythiophene polymers can often be related to the electro-conductivity of the polymer.

Thin Films of Water-Soluble Polymers

The water-soluble polymers of the invention can be used to form thin films. The thin films can be formed using any method known to those of ordinary skill in the art, having read this specification, for making thin films. In one embodiment, the thin films that are formed can be, but need not be, colored, some highly colored. In another embodiment, the thin films that are formed can be, but need not be, conductive, some highly conductive. The thin films that are formed can have varying thicknesses, as is known to one of skill in the art, having read this specification.

Other Applications for the Water-Soluble Polymers

Because of the water-solubility of the polymers of the invention, they may also be useful in biological systems. The polymers themselves may be biologically active, or alternatively can be coupled to biologically active molecules. In one embodiment, a polymer of the invention that is both water-soluble and electrically conductive can be used in a biological system for a number of uses, including as a conductor for electrical signals of biological origin or otherwise.

Polymers of the invention may also be useful in transistors or light-emitting diodes (LEDs), which can be used in electronic displays.

Method of Making Water-Soluble Polymers of the Invention

The invention also includes methods of forming water-soluble polymers that include the steps of:

(a) combining a zerovalent highly reactive zinc species with an organic compound having at least two stable leaving groups to form a zinc derivative reagent, wherein the organic radical of the zinc derivative reagent includes a substituted thiophene group;

(b) adding an effective amount of a catalyst to initiate a polymerization reaction; and (c) combining an effective amount of an alkali metal base with the mixture to form the alkali metal salt of the polymer.

Zerovalent Highly Reactive Zinc Species

As used herein, the phrase "highly reactive" refers to the reactivity of the zinc species in organic reactions, particularly oxidative addition reactions. A zinc species is highly reactive if it reacts with a wide variety of primary, secondary, and tertiary alkyl, vinyl, and aryl halides in relatively high yields, for example, in greater than about 30% yield. In another embodiment, the yield is greater than about 50% yields. In yet another embodiment, the yield is greater than about 70%.

As used herein, the phrase "zerovalent" means that the formal oxidation state, or charge, is equal to the group number (i.e., 2) minus the number of unshared electrons (i.e., 2) minus the number of bonds (i.e., 0).

In one embodiment, the zerovalent highly reactive zinc species is a mixture or combination of zerovalent zinc metal atoms and an alkali metal salt (or salts). In one embodiment, the alkali metal salt is a salt of the counterion associated with the Zn(II) salt. That is, the alkali metal salt is a salt of sulfate, nitrate, nitrite, acetate, cyanide, or halide for example. In another embodiment, the zerovalent highly reactive zinc species includes an alkali metal salt of cyanide, a halide (e.g., F, Cl, Br, or I), or both. In yet another embodiment, the zerovalent highly reactive zinc species includes an alkali metal salt of cyanide, or an alkali metal salt of cyanide and an alkali metal salt of a halide. It is to be understood that there may be a combination of alkali metal salts with different anions in the highly reactive zerovalent zinc species used in methods of the invention.

As used herein, the phrase "mixture or combination" means that the reduction generates a physical mixture of small crystallites of zinc metal and alkali metal salt. In one embodiment the zinc metal comprises 90-95% wt-% of the mixture. In another embodiment, the zinc metal comprises 95-98 wt-% of the mixture.

Further details regarding the zerovalent highly reactive zinc species of the present invention and methods of preparing the same can be found in U.S. Pat. Nos. 5,964,919; 5,852,200; 5,756,653; 5,507,973; and 5,358,546, the disclosures of which are incorporated herein by reference. Zerovalent highly reactive zinc species are available from Rieke Metals, Inc. (Lincoln, Nebr.).

Preparation of Polymers from Highly Reactive Zinc

The zerovalent highly reactive zinc species can be used to form polymers by combining the zerovalent highly reactive zinc species with an organic compound with at least two stable leaving groups to form a zinc derivative reagent, wherein the organic radical of the zinc derivative reagent includes a thiophene group.

The at least two stable leaving groups can either be anionic or neutral leaving groups. Examples of anionic or neutral leaving groups include a halide, tosylate, triflate, phenolate, brosylate, trialkyl amine, triaryl amine, mixed tri(alkyl/aryl) amine trialkyl phosphine, triaryl phosphine, mixed tri(alkyl/aryl)phosphine, trialkyl stannane, triaryl stannane, mixed tri(alkyl/aryl)stannane, thiophene ($-SC_6H_5$), phenolate ($-OC_6H_5$), and the like. By "mixed tri(alkyl/aryl)" amine, phosphine, stannane, it is meant that the nitrogen, phosphorus, and tin can be substituted with both alkyl and aryl groups. For example, a neutral leaving group can be $P(CH_3)_2(C_6H_5)$. In one embodiment, an anionic leaving group is a halide or triflate. In another embodiment, an ionic leaving group is a halide. That is, the organozinc reagents include organozinc halides, i.e., aliphatic, aryl, heterocyclic, arylalkyl, or polymeric compounds having one or more halide groups. Thus, organozinc halides are understood to include vinyl halides. In one embodiment, the halide groups are iodide, chloride, or bromide. If the halide group is a chloride, in certain reactions an alkali metal iodide can be added to the reaction mixture to improve the reactivity.

The highly reactive zinc species and the reactive organic compound, e.g., organic halide, with which it reacts, are generally present in an amount such that the ratio of zinc to reactive organic compound is about 0.9-4 moles of zinc to 1 mole of reactive organic compound. In another embodiment, the ratio is 0.9-1.1 moles zinc to 1 mole reactive compound, i.e., about an equimolar amount. In yet another embodiment, the zinc is present in an excess amount, i.e., at least about 1.1 moles zinc to 1.0 mole reactive organic compound.

The organozinc reagents are generally stable at ambient temperatures, which therefore allows methods of the invention to be carried out in stepwise fashion. That is, they do not typically self-react, or otherwise decompose, to a significant extent. To further prevent any significant amount of decomposition, the organozinc reagents of the present invention can be stored within a temperature range of about −100° C. to about 200° C. under an argon or nitrogen atmosphere.

The zinc aryl derivatives form polymers in the presence of an effective amount of a catalyst. In one embodiment, the catalyst is a Pd(0) catalyst or a Ni(II) catalyst. By an "effective amount" of a Pd(0) catalyst or Ni(II) catalyst, it is meant that there is a sufficient amount present to effect the reaction in less than about 5 days. Typically, this is an amount of about 1-10 mole-%, and in one embodiment about 1-5 mole-%, based on the amount of organozinc reagent present.

Pd(0) catalysts that can be used include, but are not limited to, $PdL_4$, $PdL_2 L'_2$, $PdLL'_3$, or $Pd(L—L)_2$ catalyst wherein L and L' are $PF_3$, $PPh_3$, $P(OR)_3$ (wherein R is any aliphatic, aryl, or vinyl group), $AsPh_3$, CO, CN, $PEtPh_2$, $PEt_2Ph$, $P(4-MeC_6H_4)_3$, $SbPh_3$, CNR (wherein R is any aliphatic, aryl, or vinyl group), and R—C≡C—R (wherein R=any aliphatic, aryl, or vinyl group), and wherein L—L is cyclooctadiene, 1,2-bis(diphenyl-phosphino)ethane, 1,3-bis(diphenylphosphino)-propane, and [(2,2-dimethyl-1,3-dioxolane-4,5-diyl)bis(methylene)]diphenyl-phosphine.

For example, the Pd(0) catalyst can be $Pd(PPh_3)_4$, polymer-bound $Pd(PPh_3)_4$, $Pd(PF_3)_4$, $Pd(PEtPh_2)_4$, $Pd(PEt_2Ph)_4$, $Pd[P(OR)_3]_4$ (wherein R is any aliphatic, aryl, or vinyl group), $Pd[P(4-MeC_6H_4)_3]_4$, $Pd(AsPh_3)_4$, $Pd(SbPh_3)_4$, $Pd(CO)_4$, $Pd(CN)_4$, $Pd(CNR)_4$ (wherein R is any aliphatic, aryl, or vinyl group), Pd(R—C≡C—R) (wherein R is any aliphatic, aryl, or vinyl group), $Pd(PF_3)_2$, $Pd(dppe)_2$ wherein dppe is 1,2-bis(diphenyl-phosphino)ethane, $Pd(cod)_2$ wherein cod is cyclooctadiene, $Pd(dppp)_2$ wherein dppp is 1,3-bis(diphenylphosphino)propane, bis[2,2-dimethyl-1,3-dioxolane-4,5-diyl)bis(methylene)]diphenylphosphine palladium, or bis(dibenzylideneacetone)palladium. In one embodiment, the Pd(0) catalyst is of $Pd(PPh_3)_4$, polymer-bound $Pd(PPh_3)_4$, $Pd(dppe)_2$, or Pd bis(dibenzylideneacetone). In another embodiment, the Pd(0) catalyst is $Pd(PPh_3)_4$.

Examples of suitable Ni(II) catalysts include, but are not limited to $Ni(PR_3)_2X_2$ wherein R is $C_1$-$C_{300}$ alkyl, $C_6$-$C_{100}$ aryl and X is F, Cl, Br, I; $NiLX_2$ wherein L is 1,2-bis(diphenylphosphino)ethane, 1,3-bis(diphenylphosphino) propane, [2,2-dimethyl-1,3-dioxolane-4,5-diyl)bis(methylene)] diphenylphosphine, and X is F, Cl, Br, I; $N(CN)_4^{-2}$; NiO; $Ni(CN)_5^{-3}$; $Ni_2C_8^{-4}$; $NiCl_2$; $NiF_2$; $NiBr_2$; $NiI_2$ ; NiAs; Ni(d-mph)$_2$ wherein dmph is dimethylglyoximate, BaNiS; [NiX(QAS)]$^+$ wherein X is F, Cl, Br, I and QAS is As(o-$C_6H_4$ AsPh$_2$)$_3$; [NiP(CH$_2$ CH$_2$ CH$_2$ AsMe$_2$)$_3$CN]+; [Ni(NCS)$_6$]-4; $KNiX_3$ wherein X is F, Cl, Br, I; $[Ni(NH_3)_6]^{+2}$; $[Ni(bipy)_3]^{+2}$ wherein bipy is bipyridene. In another embodiment, R can be $C_1$-$C_{30}$ alkyl, $C_6$-$C_{20}$ aryl, or $C_1$-$C_{20}$ alkyl, $C_6$-$C_{10}$ aryl.

The zerovalent highly reactive zinc species utilized in methods of the invention can be used to form regioselective or regiorandom polymers. Whether a regiorandom polymer or a regioselective polymer is formed from the organozinc intermediates depends on the polymerization catalyst used. For example, the zerovalent highly reactive zinc can be used to form a regioselective head-to-tail poly-3-hexyl-thiophene in the presence of a Ni(II) catalyst, whereas a regiorandom poly-3-hexyl-thiophene results if a Pd(0) catalyst is used.

In the polymerization process, the highly reactive zinc of the present invention is used in a regioselective manner in the preparation of zinc derivatives of di- or monohalo, di- or mono-substituted thiophene (wherein the thiophene moiety can be substituted with one or two of -alkylCO$_2$-stable leaving group, —(CH$_2$)$_n$-aryl-(CH$_2$)$_n$CO$_2$-stable leaving group, —(CH$_2$)$_n$-heterocycle-(CH$_2$)$_n$CO$_2$-stable leaving group, —(CH$_2$)$_n$-cycloalkyl-(CH$_2$)$_n$CO$_2$-stable leaving group, where n is an integer from 0 to about 200), and the like. In other embodiments, n can be about 1 to about 50, about 1 to about 30, or about 1 to about 10. By combining the zerovalent highly reactive zinc species with an organic compound with at least two stable leaving groups, a zinc derivative reagent can be formed, wherein the organic radical includes a thiophene group. These zinc derivative reagents undergo smooth polymerization in the presence of an effective amount of a catalyst such as a Pd(0) catalyst or a Ni(II) catalyst. In one embodiment, this polymerization is generally conducted at temperatures of about −100° C. to about 150° C. In another embodiment, the polymerization is conducted at temperatures of about −20° C. to about 100° C. The polymerization can be carried out in the same solvent as was the preparation of the organozinc reagent.

Once the polymerization has been accomplished, the next step of methods of the invention include combination of an effective amount of an alkali metal base with the mixture to form the alkali metal salt of the polymer. It is the alkali metal salt of the polymer that is water-soluble.

Methods of the invention can utilize any alkali metal base known to those of skill in the art, including, but not limited to, lithium hydroxide (LiOH), sodium hydroxide (NaOH), potassium hydroxide (KOH), rubidium hydroxide (RbOH), and cesium hydroxide (CsOH). In one embodiment, NaOH or KOH are utilized. In another embodiment, NaOH is utilized.

Alkali metal bases are combined with the mixture in an "effective amount". As used herein, an "effective amount" means an amount capable of converting at least about 5% of the polymer to the alkali metal salt of the polymer. In one embodiment, an "effective amount" of the alkali metal base is an amount capable of converting at least about 75% of the polymer to the alkali metal salt of the polymer. In another embodiment, an effective amount of the alkali metal base is an amount capable of converting at least about 90% of the polymer to the alkali metal salt of the polymer.

In one embodiment of the invention, the alkali metal base is added to the polymer in an amount that is a molar excess, with regard to the polymer. In another embodiment, the alkali metal base is added to the polymer in an amount that creates a molar ratio of at least about 2 to 1 (alkali metal base to polymer). In another embodiment, the alkali metal base is added to the polymer in an amount that creates a molar ratio of at least about 5 to 1 (alkali metal base to polymer).

The alkali metal based can be combined with the mixture using any method known to those of skill in the art. In one embodiment, the alkali metal base is added by forming an aqueous solution containing the alkali metal base and stirring the solution. In one embodiment, the mixture is stirred and heated as well. General techniques and methods known and used by those of ordinary skill in the art can also be utilized in methods of the invention.

The following Examples are intended to illustrate the above invention and should not be construed as to narrow its scope. One skilled in the art will readily recognize that these Examples suggest many other ways in which the present invention could be practiced. It should be understood that many variations and modifications may be made while remaining within the scope of the invention.

WORKING EXAMPLES $^1$H NMR (CDCl$_3$) spectra were recorded on a 200-MHz or a 360-MHz NMR spectrometer. Analytical gas chromatography analysis was carried out using stainless steel columns or a "megabore" glass capillary column. Stainless steel columns (⅛" diameter) were typically packed with Silicon OV-17 (3%) on Chromosorb W-AW (100/120 mesh) with column lengths varying from 10 to 15 feet.

Reactions were carried out on a dual manifold vacuum/argon system. The Linde™ prepurified grade argon was further purified by passing it through a 150° C. catalyst column (BASF R3-11) and then through a column of phosphorous pentoxide, followed by a column of granular potassium hydroxide. The handling of air-sensitive materials was often performed under argon in a Vacuum Atmospheres Company drybox. Chemical reagents were primarily purchased from Aldrich Chemical Co., Inc. (Milwaukee, Wis.), and were used as received unless indicated otherwise. THF and DME were freshly distilled before use from sodium/potassium alloy under a purified argon atmosphere.

Example #1

Synthesis of 4-thiophen-3-yl-butyric acid ethyl ester

Scheme 1 below illustrates the production of 4-Thiophen-3-yl-butyric acid ethyl ester.

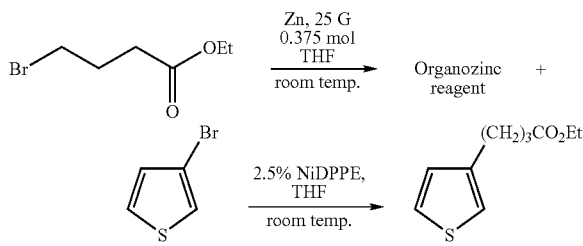

A 250 mL two-necked round bottom flask, stir bar, and condenser were taken from the oven. The joints of the round bottom flask were greased and the flask was equipped with a septum and an air inlet valve. The flask was charged with argon and a vacuum was drawn for about 15 minutes. This was repeated three times. Next, approximately 4.9 grams of Rieke Zinc (Rieke Metals, Inc., Lincoln, Nebr.) was transferred to the flask via a teflon cannula. 11.3 grams of ethyl 4-bromo butyrate was weighed into a disposable 10 mL plastic syringe. The ethyl 4-bromo butyrate was added to the round bottom flask in increments of about 1 mL every about 5 minutes. After all of the ethyl 4-bromo butyrate had been added (about 40 minutes) the flask was stirred for about 30 minutes and returned to room temperature. A G.C. quench was then taken and added to about 3 mL HCl/ether and shot at 80° C. on a packed column. The G.C. quench showed that all of the halide had been converted to the organozinc reagent. The organozinc reagent was drawn off, centrifuged down, and diluted to 100 mL in tetrahydrofuran (THF).

3.0 grams of Nickel(II) 1,2-bis(diphneylphosphino)ethane (NiDPPE) was placed into a 100 mL round bottom flask. A septa was placed on the flask and 90 mL of tetrahydrohran (THF) was added. The NiDPPE/THF solution was added as a slurry to a 1 L two-necked round bottom flask under an argon atmosphere. The organozinc reagent prepared above, was added quickly via cannula. 34 g of 3-bromothiophene was added via an addition funnel over 5 minutes. The solution was heated to about 50° to 60° C. for about 5 minutes. The heat was turned off, and the mixture sat overnight. Then, 0.66 g NiDPPE was added and the solution was heated for 5 minutes. Based on gas chromatography, almost all of the 3-bromothiophene was consumed from the reaction mixture.

The reaction mixture was then poured into a 2 L beaker containing ice. 3 M HCl was added to keep the layers separated. The mixture was then placed into a separatory funnel, and 500 mL ether was added. The solution was extracted and washed with 2×250 mL water, 1×250 mL bicarbonate solution, and 1×250 mL brine. The extracts were then dried and concentrated.

The concentrated product was dissolved in 300 mL of heptane (Fisher, Fairlawn N.J.) and run through 2 inches of silica gel. The silica gel was washed with 750 mL heptane. 7 g of 50% pure product was recovered. The silica gel was washed with 1 L of heptane, and 5 more grams of product was recovered. The silica gel was washed with a 30/70 mixture of ethyl acetate (Fisher)/heptane and 19 g of product was obtained. The product was an orange oil.

A 10 cm wide column was packed with 800 g of silica gel in heptane. The product was loaded onto the column and the column was eluted with a 10/90 ethyl acetate/heptane solution. 100 mL fractions were collected as soon as the product started eluting. Fractions A-L were collected. Fractions B-H included 11.63 g of a yellow oil that was 81% pure product. Fractions I-L included 4 g of yellow oil that were 57% pure.

Gas chromatography mass spectrometry (GCMS) was run on the product and it was determined that the product had a molecular ion (MI) of 198, indicating that 4-Thiophen-3-yl-butyric acid ethyl ester had been formed.

Example 2

Synthesis of 4-(2,5-dibromo-thiophen-3-yl)-butyric acid ethyl ester

Scheme 2 below shows the synthesis of 4-(2,5-Dibromo-thiophen-3-yl)-butyric acid ethyl ester starting from the product of Example 1.

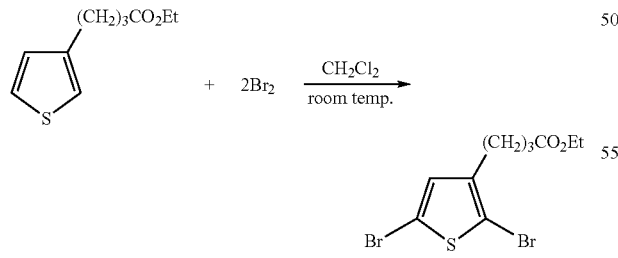

11.6 g of 4-thiophen-3-yl-butyric acid ethyl ester and 30 mL of $CH_2Cl_2$ were placed into a 100 mL 2-neck round bottom flask fitted with an addition funnel. The flask was connected to a potassium hydroxide/oil bubbler. 7 mL of $CH_2Cl_2$ were placed into the addition funnel, followed by 5 mL of $Br_2$. The $CH_2Cl_2/Br_2$ mixture was swirled and the mixture was added to the round bottom flask over 20 minutes. The mixture was stirred for 5 minutes after the $CH_2Cl_2/Br_2$ mixture was done being added. Another 0.23 g of $Br_2$ was added and the solution was stirred for 5 minutes. 25 mL of sodium thiosulfate was added and the solution was stirred for 15 minutes.

100 mL of ether was added to the separatory funnel. The product was extracted and washed with 3×50 mL sodium thiosulfate, 1×50 mL bicarbonate solution, and 1×50 mL brine. The extract was then dried and concentrated to result in 19.54 g of a dark black oil.

The product was diluted to 200 mL with heptane and the mixture was filtered through 3 inches of silica gel. 500 mL of heptane was ran through the silica gel in order to remove some of the impurities. Next, 1 L of 10/90 ethyl acetate/heptane was run through the silica gel. The 1 L of 10/90 ethyl acetate/heptane containing the product was then rotovapped after drying and filtering.

The dried extract was then distilled giving four fractions.

| Fraction | Temperature | |
|---|---|---|
| A | 61-71° C. | |
| B | 95-118° C. | |
| C | 118-125° C. | 99% pure 4.33 g; light yellow oil |
| D | 125-128° C. | 99% pure 1.77 g; light yellow oil |

GC-MS of fractions C and D showed a molecular ion of 356.

Example 3

Preparation of Regioregular Polymer

Scheme 3 below shows the polymerization of the product of Example 2 to form a regioregular polymer.

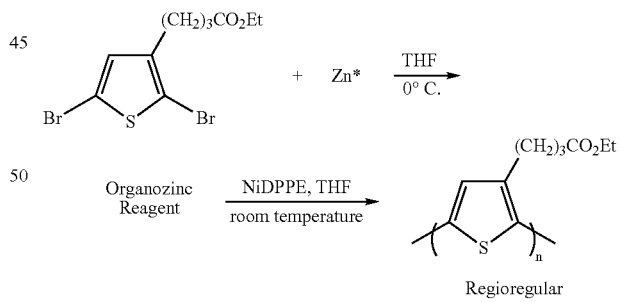

1.2 grams of zerovalent highly reactive zinc (Rieke Metals, Inc., Lincoln Nebr.) was transferred into a 125 mL Wheaton bottle that included 25 mL THF and a stir bar. The mixture was cooled down using an ice-water bath. 6 grams of the product of Example 2,4-(2,5-Dibromo-thiophen-3-yl)-butyric acid ethyl ester, was added at a rate that kept the temperature of the solution at or below 20° C. The mixture was stirred for 1 hour, at which time a G.C. quench showed that all of the 4-(2,5-dibromo-thiophen-3-yl)-butyric acid ethyl ester had been converted.

A 50 mL two-necked round bottom flask was placed under an argon atmosphere. 0.02 grams of NiDPPE was placed into the flask along with 1 mL THF. The organozinc 4-(2,5-dibromo-thiophen-3-yl)-butyric acid ethyl ester produced above was added quickly via syringe. The internal temperature of the solution reached 31° C. The solution was stirred for about 4 hours at room temperature.

Methanol (Fisher) was added to the polymerized thiophene, and the solution was poured into 100 mL of methanol in a beaker while stirring. After all of the polymer was transferred to the beaker, the solution was stirred for about 15 minutes. The solution was then vacuum filtered and placed into a hood to dry. 1.2 grams of a black solid was obtained.

An NMR of the product was obtained that showed only 1 peak at 7.0, confirming that the polymer was regioregular. The product was placed in a vacuum dessiccator and pumped on for about 72 hours.

Scheme 4 below shows the conversion of the thiophene polymer to a water soluble polymer.

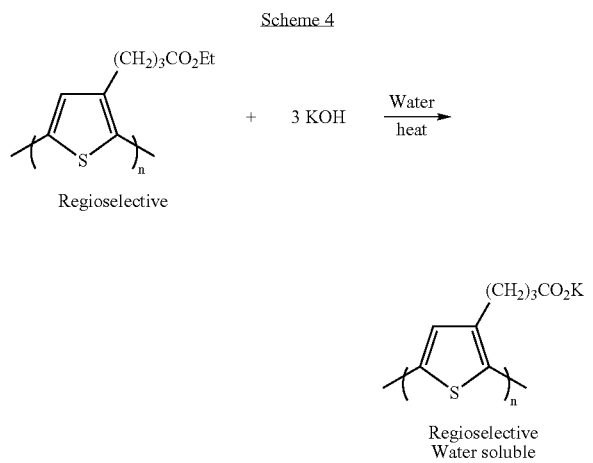

Scheme 4

0.2 grams of the thiophene polymer prepared above was placed into a 10 mL single-neck round bottom flask. 0.17 grams of potassium hydroxide (KOH) was dissolved in 2 mL water. A stir bar and the KOH solution were added to the thiophene polymer in the round bottom flask. A condenser was put on the round bottom flask and the round bottom flask was purged with argon. The reaction was heated using a heating mantle with the Variac on 55%. After 15 minutes the solution changed to a dark orange. The solution was refluxed for 1 hour.

A small amount of the mixture was removed with a pipette, and transferred to a 25 mL Erlenmeyer flask containing 25 mL of 3 M HCl. The product of the reaction precipitated out immediately as a black solid. The mixture was stirred for about 15 minutes and then filtered using a vacuum Buchner funnel. The crystals were washed with water and placed in a vial under vacuum in a dessiccator. The dessiccator was pumped on for about 24 hours. The vacuum was maintained for about 48 hours.

Another aliquot of the mixture was placed on a glass plate and spread out with another piece of glass. The spread solution was allowed to air dry. The solution dried to a dark green film.

Example 4

Preparation of Regiorandom Polymer

Scheme 5 below shows the polymerization of the product of Example 2 to form a regiorandom polymer.

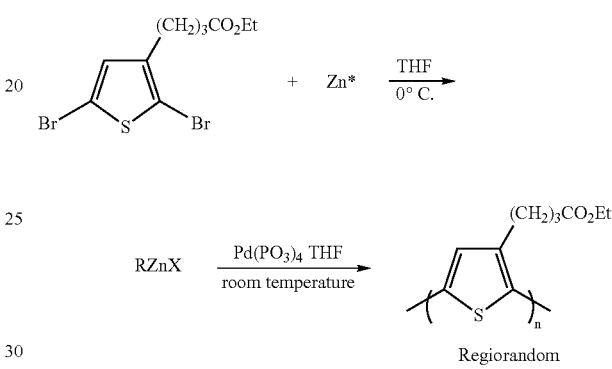

Scheme 5

1.1 grams of reactive zinc (Rieke Metals, Inc.) was transferred into a 125 mL Wheaton bottle that included 25 mL THF and a stir bar. The mixture was cooled down using an ice-water bath. 6 grams of the product of Example 2, 4-(2,5-dibromo-thiophen-3-yl)-butyric acid ethyl ester, was added at a rate that kept the temperature of the solution at or below 20° C. The mixture was stirred for 1 hour, at which time a G.C. quench showed that all of the 4-(2,5-dibromo-thiophen-3-yl)-butyric acid ethyl ester had been converted.

A 50 mL two-necked round bottom flask was placed in the dry box. 0.02 grams of palladium triphenylphosphine (Pd(PPh$_3$)$_4$) was placed into the flask along with 1 mL THF. The organozinc 4-(2,5-dibromo-thiophen-3-yl)-butyric acid ethyl ester produced above was added quickly via syringe. The solution was heated with the Variac at 20% at 120 V. After about 1 hour of heating, the internal temperature was up to 60° C. The heating mantle was removed and the solution was stirred at room temperature for about 30 minutes. The heating mantle was then repositioned and the solution was heated for about 1 hour at 20% at 120 V.

The resulting mixture was poured into 100 mL of methanol in a beaker. A sticky red solid precipitated out of solution. The methanol was poured off and the resulting polymer was washed with water. The polymer was scraped into a drying dish and was dried in the hood overnight. 1 gram of a red semi-solid was obtained. The polymer was placed in a vacuum dessiccator for about 24 hours under vacuum.

An NMR of the product was obtained showing four peaks instead of one, indicating that it was a regiorandom polymer. The remainder of the polymer was placed in a vacuum dessiccator for about 72 hours to dry.

Scheme 6 below shows the conversion of the thiophene polymer to a water-soluble polymer.

Scheme 6

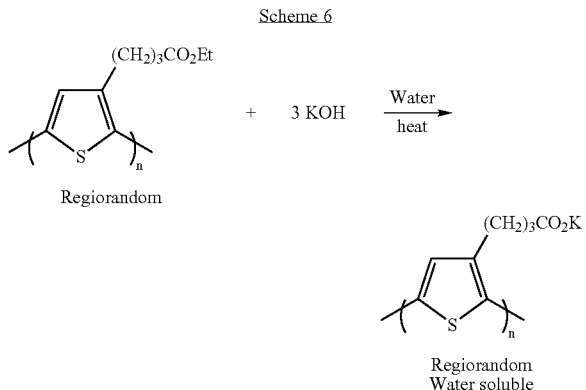

Regiorandom

Regiorandom
Water soluble 0.2 grams of the thiophene polymer prepared above was placed into a 25 mL round bottom flask. 0.17 grams of potassium hydroxide (KOH) was dissolved in 4 mL water. A stir bar and the KOH solution were added to the thiophene polymer in the round bottom flask. A reflux condenser was put on the round bottom flask and the round bottom flask was purged with argon. The reaction was stirred and heated to reflux. As it started heating, the water layer turned yellowish orange. After about 30 minutes of reflux, the regiorandom polymer had not dissolved as well as the regioselective polymer of Example 3.

The reaction was allowed to cool and an addition 0.17 g of KOH was added. This addition was done to make the KOH/water ratio the same as in Example 3. The mixture was heated again and the polymer starting dissolving. The mixture was refluxed for about 1 hour. At this time, most of the polymer had gone into solution. The next day, some of the polymer containing solution was pipeted into a 25 mL Erlenmeyer flask with 10 mL 3 M HCl in it. The solution was stirred for about 15 minutes. The solution was then filtered and washed with water. The resulting product was placed into a vacuum dessiccator and pumped on for about 24 hours. A reddish solid was the result.

Another aliquot of the mixture was warmed again in an effort to try to dissolve all of the polymer. The mixture was spread in an aluminum pan and allowed to dry in the hood overnight. The film that was formed was not very solid and had pieces of solid in it.

The foregoing discussion and examples are illustrative of the invention. However, since many embodiments of the invention can be made without departing from the spirit and scope of the invention, the invention resides wholly in the claims hereinafter appended.

What is claimed is:

1. A method of forming a water-soluble polymer having formula I:

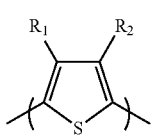

(I)

wherein $R_1$ and $R_2$ are independently —H, -alkyl$CO_2$A, —$(CH_2)_n$-aryl-$(CH_2)_n CO_2$A, —$(CH_2)_n$-heterocycle-$(CH_2)_n CO_2$A-, or —$(CH_2)_n$-cycloalkyl-$(CH_2)_n CO_2$A, where n is an integer from 0 to about 200, and A is an alkali metal cation;

with the proviso that only one of $R_1$ and $R_2$ can be —H; comprising:

(a) combining a zerovalent highly reactive zinc species with an ester of an $R_1$,$R_2$ thiophene having at least two stable leaving groups to form a zinc derivative reagent;

(b) adding a catalyst to polymerize the zinc derivative reagent to provide a polymer; and (c) adding an alkali metal base to form an alkali metal salt of the polymer.

2. The method of claim 1, wherein the catalyst is a Pd(0) catalyst.

3. The method of claim 1, wherein the catalyst is a Ni(II) catalyst.

4. The method of claim 1, wherein the alkali metal base is LiOH, NaOH, KOH, CsOH, or RbOH.

5. The method of claim 1, wherein the leaving groups comprise chloride, bromide, or iodide.

6. The method of claim 1, wherein the alkali metal base is added via an aqueous solution.

7. The method of claim 1, wherein $R_1$ is —H and $R_2$ is -alkyl$CO_2$A.

8. The method of claim 1, wherein the alkyl group has from 1 to about 30 carbon atoms and n is from 0 to about 30.

9. The method of claim 1, wherein the water-soluble polymer has a water solubility of $10^{-3}$ molar to about 10 molar.

10. The method of claim 1, wherein about 0.9 to about 4 moles of the zerovalent highly reactive zinc species is employed, with respect to the ester of the $R_1$, $R_2$ thiophene that has at least two stable leaving groups.

11. The method of claim 1, wherein about 0.01 mol % to about 10 mol % catalyst is employed, with respect to the ester of the $R_1$, $R_2$ thiophene that has at least two stable leaving groups.

12. The method of claim 1, wherein the catalyst employed is a Ni(II) catalyst and the water-soluble polymer is a regioregular polymer.

13. A method of forming a water-soluble regioregular polymer having formula I:

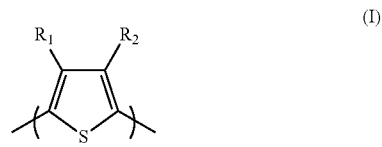

(I)

wherein $R_1$ and $R_2$ are independently —H, -alkyl$CO_2$A, —$(CH_2)_n$-aryl-$(CH_2)_n CO_2$A, —$(CH_2)_n$-heterocycle-$(CH_2)_n CO_2$A-, or —$(CH_2)_n$-cycloalkyl-$(CH_2)_n CO_2$A, where n is an integer from 0 to about 200, and A is an alkali metal cation; with the proviso that only one of $R_1$ and $R_2$ is —H; comprising:

(a) reacting a compound of the formula:

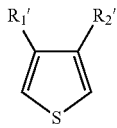

wherein $R_1'$ and $R_2'$ are independently —H, -alkyl$CO_2$ester, —$(CH_2)_n$-aryl-$(CH_2)_n CO_2$ester, —$(CH_2)_n$-heterocycle-$(CH_2)_n CO_2$ester, or —$(CH_2)_n$-cycloalkyl-$(CH_2)_n CO_2$ester, where n is an integer from 0 to about 200, and ester is an alkyl ester, with the proviso that only one of $R_1'$ and $R_2'$ is —H, with a halogen selected from bromine and iodine, to provide a halogenated thiophene;

(b) reacting a zerovalent highly reactive zinc species with the halogenated thiophene to provide a zinc derivative reagent;

(c) adding a Ni(II) catalyst to polymerize the zinc derivative reagent to provide a polymer; and (d) adding an alkali metal base to form an alkali metal salt of the polymer.

14. The method of claim 13, wherein the halogen is bromine.

15. The method of claim 13, wherein the alkali metal salt is Li, Na, or K.

16. The method of claim 13, wherein $R_1$ is —H and $R_2$ is —$(C_1-C_{20})$alkyl$CO_2$A.

17. The method of claim 13, wherein the catalyst employed is a Ni(II) catalyst and the water-soluble polymer is a regioregular polymer.

18. An electroconductive water-soluble thin film comprising a water-soluble polymer prepared by the method of claim 1.

19. An electronic component that includes an organic thin film transistor or an organic light emitting diode comprising a water-soluble polymer prepared by the method of claim 1.

20. The electronic component of claim 19 wherein the water-soluble polymer is a regioregular polymer.

* * * * *